United States Patent [19]

Hartmann

[11] 4,049,958

[45] Sept. 20, 1977

[54] PROGRAMABLE FILTER USING CHIRP-Z TRANSFORM

[75] Inventor: Clinton S. Hartmann, Richardson, Tex.

[73] Assignee: Texas Instruments Incorporated, Dallas, Tex.

[21] Appl. No.: 554,884

[22] Filed: Mar. 3, 1975

[51] Int. Cl.² .................... G06G 7/19; G06F 15/34
[52] U.S. Cl. ........................... 235/193; 235/156; 235/181
[58] Field of Search .......... 235/193, 181, 156, 150.53, 235/152; 324/77 A, 77 B, 77 G; 333/30 R, 72

[56] References Cited

U.S. PATENT DOCUMENTS

| | | | |
|---|---|---|---|
| 3,586,843 | 6/1971 | Sloane | 235/156 |
| 3,629,509 | 12/1971 | Glaser | 235/152 UX |
| 3,803,395 | 4/1974 | Quate | 235/193 |
| 3,900,721 | 8/1975 | Speiser et al. | 235/156 |
| 3,920,974 | 11/1975 | Means | 235/152 |
| 3,925,646 | 12/1975 | Richardson et al. | 235/152 |
| 3,925,653 | 12/1975 | Otto | 235/181 |

FOREIGN PATENT DOCUMENTS

1,452,084   8/1966   France ................... 235/181

OTHER PUBLICATIONS

Whitehouse et al.; High Speed Serial Accen Linear Transform Implementations, Digital Computer Symposium, Orlando, Florida, Jan. 1973.

Means et al., Image Transmission via Spread Spectrum Techniques, ARPA Quarterly report June-Oct. 1973, Appendix D, pp. 93-107.

Cooper & McGillem, *Methods of Signal and System Analysis,* 1967 Holt, Rinehart & Winston, Inc., pp. 105-106.

Primary Examiner—Jerry Smith
Attorney, Agent, or Firm—Harold Levine; James T. Comfort; James J. Elacqua

[57] ABSTRACT

A transform structure employing surface wave devices performs Fourier transform operations on a time-limited substantially band limited signal. The output signal of the transform structure is related to the Fourier transform of the input signal in a manner which permits forming the product of this output with a similar output of a second transform structure. This product is inverted by a third transform structure so as to provide the convolution of the two original input functions. The overall structure comprises a filter apparatus readily programable in either the time or frequency domain.

20 Claims, 6 Drawing Figures

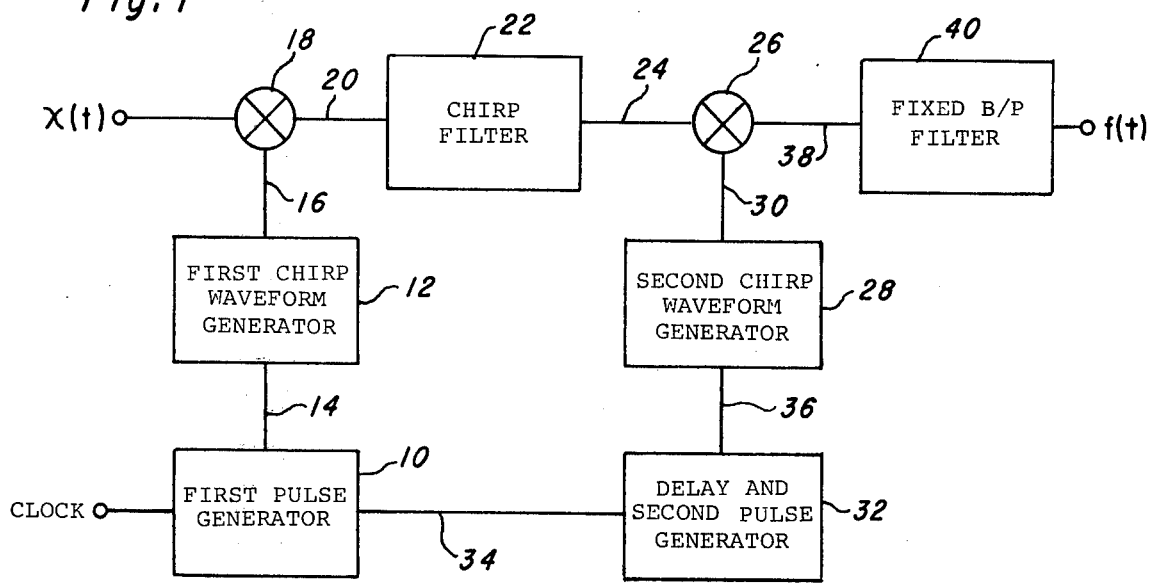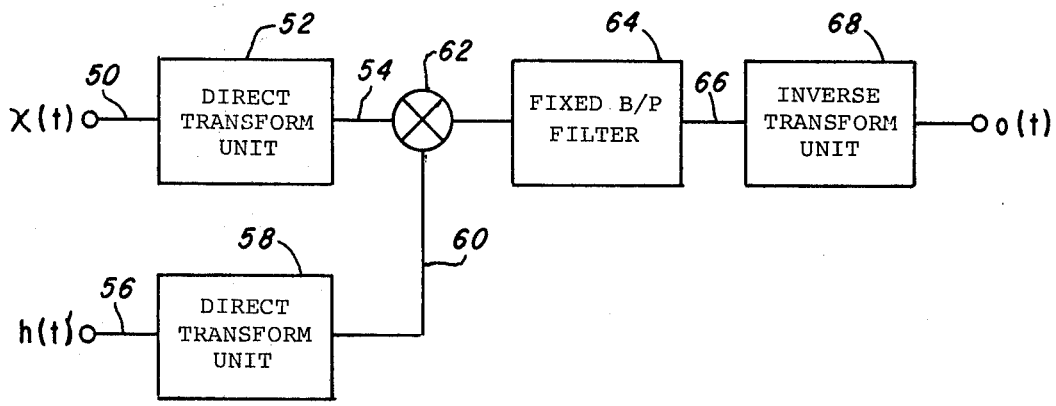

PROGRAMABLE FILTER USING CHIRP-Z TRANSFORM

This invention relates generally to electrical filters and in particular to electrical filters which are programable in either the time or frequency domain.

In the broad art of electrical filtering there exists a subclass of filters which may be referred to as programable filters. In contrast with the fixed tuned filter, a programable filter is one whose impulse response is variable. The impulse response can be programed to be any of a wide class of desired functions. A programable filter may, for example, simply have a variable bandpass region. In another case it may be desirable to vary the impulse response of a chirp pulse compression filter. Among the many types of systems that would benefit from the use of programable filters are communication systems, radar systems, and electronic-countermeasure systems.

The present invention comprises an improved programable filter which, in the preferred embodiment, employs a plurality of acoustic surface wave devices (SWDs). The programable filter is adapted to the processing of time-limited substantially band-limited input signals. In one aspect of the invention, however, the programable filter is adapted so as to permit processing of a continuous signal. The filters which comprise the subject of this invention may be programable in either the time domain or the frequency domain.

An important advantage of this improved programable filter over related prior art filters, such as Kalman filters, is its relative simplicity and ease of fabrication. A second advantage is that, in addition to performing adaptive filtering, the programable filter can provide the frequency spectrum of the input signal. A third advantage of the improved programable filter is that the basic transform hardware which forms the heart of the programable filter can be used for many other signal processing applications that are not adaptive filtering functions. These fall into the categories of spectral analysis and pattern recognition.

An algorithm for implementing a Z-transform was described in a paper entitled "The Chirp Z-Transform Algorithm", L. R. Rabiner, R. W. Schafer, and C. N. Rader, IEEE Transactions on Audio and Electro Acoustics, Vol. AU-17, No. 2, June 1969, pages 86–92. In a paper given at the All Applications Digital Computer Symposium in Orlando, Fla. Jan. 23–25, 1973, and entitled "High Speed Serial Access Linear Tramsform Implementations", H. J. Whitehouse has shown how a specific implementation of this transform may be realized with chirp filters and mixers. The programable filter of the present invention employs a transform structure which is related to that disclosed by Whitehouse but which is modified and improved in certain important respects so as to be adapted to use in the programable filter application.

Briefly, the programable filter is designed to process an input function which is limited in time to a time interval $\Delta T$ and in frequency to a band of frequencies $\Delta F/2$ on either side of a center frequency $f_0$. As is well known, it is impossible to exactly satisfy both the time-limited and band-limited conditions simultaneously, but in practice they can both be satisfied sufficiently well for the purposes of the present invention. This input signal is processed by a first transform structure in which the input signal is first multiplied by a chirp waveform. The product of these two functions is then filtered by a fixed chirp filter the output of which is multiplied by a second chirp waveform. The product of this second multiplication comprises the output of the transform structure and will be shown subsequently to be closely related to the Fourier transform of the input signal. In one aspect of the invention, which comprises a filter programable in the frequency domain, a second time function is generated at this point to be representative of the desired frequency response of the filter. A product is formed between this desired frequency response function and the Fourier transform function from the transform structure. This "frequency-domain" product is then transformed by an inverse transform structure so as to provide the convolution between the input function and the impulse response of the filter represented by the frequency-domain function. This filter impulse response is varied by simply altering the time function which defines the frequency-domain response of the filter.

In a second aspect of the invention, which comprises a filter programable in the time domain, a time function is generated to represent the desired impulse response of the filter. This impulse response time function is transformed by a second direct transform structure and a product is formed between the output of this impulse response transform structure and the output of the transform structure which operates on the input signal. Again, this product function is inverted by an inverse transform structure so as to provide the convolution between the impulse response and the input signal.

While the basic programable structure is adapted to the processing of short segments of the input function, the invention in another aspect is capable of processing long continuous segments of an input function. It is further noted that in the preferred embodiment of the invention, the various chirp waveforms and chirp filters are provided by SWDs as is well known in the art.

It is an object of the invention to provide an improved programable filter for use in connection with substantially band-limited input signals.

It is another object of the invention to provide a filter which is programable in either the frequency of time domains.

It is a further object of the invention to provide a programable filter which in addition to its filtering function provides spectral information about the input signal.

It is yet another object of the invention to provide an improved Fourier transform apparatus.

Other objects and features of the invention will be made apparent by a consideration of the following detailed description in connection with the attached drawings wherein:

FIG. 1 illustrates a basic transform unit.

FIG. 2 is a diagram of a time-domain programable filter.

Figure 3:
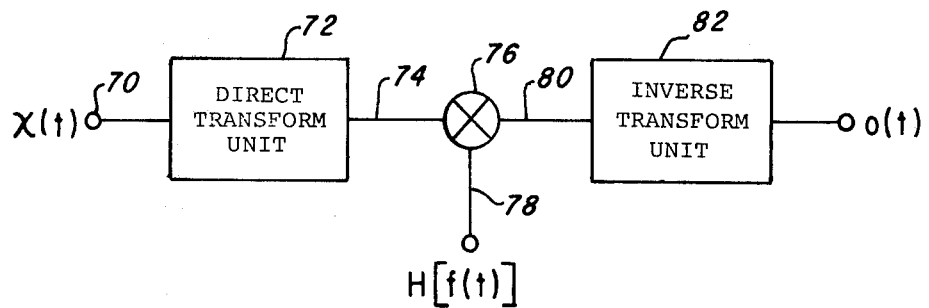
FIG. 3 shows a frequency-domain programable filter.

FIG. 1 is a diagram of a transform unit which comprises a basic element of the programable filter. The transform unit processes an input signal $x(t)$ and produces an output signal $f(t)$. A limited time segment of $x(t)$ is processed by the transform unit, the length of this time segment being given by $\Delta T$. The processing sequence is initiated by a clock signal which causes first pulse generator 10 to provide a pulse on line 14 to first chirp waveform generator 12. For the purposes of this description, a chirp waveform will be defined as an approximately sinusoidal function having a substantially linearly increasing or decreasing frequency. The duration of the waveform provided by generator 12 may be equal to or greater than $\Delta T$, and for the purposes of the present development will be assumed to be equal to $\Delta T$. Similarly, the bandwidth of the waveform provided by generator 12 must be equal to or greater than the input signal bandwidth $\Delta F$ and for the purposes of the development will be assumed to be equal to $\Delta F$. The output of generator 12 is coupled by line 16 to a first mixer 18 where it is multiplied with input signal $x(t)$. Since the waveform provided by generator 12 is of length $\Delta T$, the mixing operation in mixer 18 has the effect of gating into the transform unit a segment of the input signal of length $\Delta T$.

The product provided by mixer 18 is coupled by line 20 to chirp filter 22. Chirp filter 22 is a fixed filter having an impulse response with the form of a chirp waveform. The frequency slope $\Delta f/\Delta t$ of this impulse response is the negative of the slope $\Delta f/\Delta t$ of the waveform provided by generator 12. The bandwidth of this chirp filter is at least twice the bandwidth of the waveform provided by generator 12 and in the present case will be taken to be 2 $\Delta F$. If the center frequency of the waveform provided by generator 12 is denoted as $f_1$, then the center frequency of chirp filter 22 must be the quantity $f_0 + f_1$ where $f_0$ is within the bandwidth of input signal $x(t)$.

The output of chirp filter 22, appearing on line 24, is multiplied in mixer 26 with the waveform provided by second chirp waveform generator 28. The waveform provided by generator 28 on line 30 is similar to the waveform provided by generator 12 on line 16, both waveforms having the same frequency slope, time duration, and bandwidth. The center frequency of the waveform provided by generator 28, however, may differ from that of the waveform provided by generator 12 and the output of generator 28 is delayed in time from the output of generator 12 by a time equal to the time delay through chirp filter 22 at its center frequency. This time delay is provided by first pulse generator 10 operating in conjunction with delay and second pulse generator 32. At the same instant that a pulse from first pulse generator 10 appears on line 14, a second pulse is output on line 34. Delay and second pulse generator 32 monitors the time of occurrence of the pulse appearing on line 34 and at a fixed time delay thereafter outputs a pulse on line 36. Generator 28 in response to this pulse provides a chirp waveform on line 30 which lags the chirp waveform on line 16 by the desired time delay.

It will be recalled that the duration of the signal appearing on line 20 is $\Delta T$, while the length of the impulse response of chirp filter 22 is of length 2 $\Delta T$. Those skilled in the art will recognize therefore, that the duration of the output of chirp filter 22 will be 3 $\Delta T$. It will be seen subsequently, however, that only the middle $\Delta T$ of the chirp filter output contains useful information. Since the output of generator 28 is of duration $\Delta T$ and is appropriately delayed, it follows that only this central $\Delta T$ portion of the chirp filter output enters the product formed by mixer 26. This product is coupled by line 38 to fixed bandpass filter 40. The output of bandpass filter 40 is the output $f(t)$ of the transform unit.

Mixers 18 and 26 as well as all other mixers appearing in the various embodiments of the invention to be disclosed may each be similar to a mode 10514A mixer manufactured by Hewlett-Packard, Incorporated of Palo Alto, California. Generators 12 and 28 as well as chirp filter 22 in the preferred embodiment each comprises an SWD having an impulse response in the form of the appropriate chirp waveform. Such SWD chirp filter devices are well known in the art and, inter alia, comprise the subject matter of U.S. Pat. No. 3,675,163 entitled "Cascaded FM Correlators For Long Pulses" and assigned to the assignee of the present invention. Fixed bandpass filter 40 may also comprise an SWD as is well known in the art. Pulse generator and delay means such as those comprising generators 10 and 32 are commercially available in a large variety of forms and require no further elaboration here.

The transform properties of the transform unit illustrated in FIG. 1 may be demonstrated with the aid of the following mathematical derivation. To simplify the mathematics, all uniform time delay terms are ignored in this development. In other words, all waveforms are assumed to be centered at $t = 0$. The form of the input signal $x(t)$ is assumed to be:

$$x(t) = \begin{cases} s(t) \exp(j2\pi f_0 t) + s^*(t) \exp(-j2\pi f_0 t) & \text{for } |t| \leq \frac{\Delta T}{2} \\ 0 & \text{for } |t| \geq \frac{\Delta T}{2} \end{cases} \quad (1)$$

where $s(t)$ and $s^*(t)$ are bandlimited to $\Delta F$.

In this development the symbol * is used to denote the operation of complex conjugation. It will be seen, therefore, that while the quantity $s(t)$ may in general be complex, the function $x(t)$ is a real function. The chirp waveform provided by generator 12 is of the form:

$$C_1(t) = \begin{cases} \exp[j2\pi(f_1 t - \Delta F t^2/2 \Delta T)] \\ + \exp[-j2\pi(f_1 t - \Delta F t^2/2 \Delta T)] & \text{for } |t| \leq \frac{\Delta T}{2} \\ 0 & \text{for } |t| \geq \frac{\Delta T}{2} \end{cases} \quad (2)$$

The product formed by mixer 18 will also be of duration $\Delta T$ and is given by the following expression:

$$x(t) \cdot C_1(t) = \begin{cases} s(t) \exp\{j2\pi[(f_0+f_1)t - \Delta F t^2/2 \Delta T]\} \\ + s^*(t) \exp\{-j2\pi[(f_0+f_1)t - \Delta F t^2/2 \Delta T]\} & \text{for } |t| \leq \frac{\Delta T}{2} \\ 0 & \text{for } |t| \geq \frac{\Delta T}{2} \end{cases} \quad (3)$$

Rigorously this product will also include difference frequency terms, but since these difference frequency terms will subsequently be eliminated by the action of chirp filter 22, they have not been included in the expression above. The impulse response $i(t)$ of chirp filter 22 is given by:

$$i(t) = \begin{cases} \exp\{j2\pi[(f_0+f_1)t + \Delta Ft^2/2\,\Delta T]\} \\ + \exp\{-j2\pi[(f_0+f_1)t + \Delta Ft^2/2\,\Delta T]\} \text{ for } |t| \leq \Delta T \\ 0 \qquad\qquad\qquad\qquad\qquad\qquad \text{for } |t| \geq \Delta T \end{cases} \quad (4)$$

For those times in the range between $-\Delta T/2$ and $\Delta T/2$ the output of chirp filter 22 may be expressed as follows:

$$[x(t) \cdot C_1(t)] \otimes i(t) =$$
$$\int_{-\Delta T/2}^{\Delta T/2} [s(\tau) \exp\{j2\pi[(f_0+f_1)\tau - \Delta F\tau^2/2\,\Delta T]\}$$
$$+ s^*(\tau) \exp\{-j2\pi[(f_0+f_1)\tau - \Delta F\tau^2/2\,\Delta T]\}] \quad (5)$$
$$[\exp\{j2\pi[(f_0+f_1)(t-\tau) + \Delta F(t-\tau)^2/2\,\Delta T]\}$$
$$+ \exp\{-j2\pi[(f_0+f_1)(t-\tau) + \Delta F(t-\tau)^2/2\Delta T]\}]\, dt$$

where the symbol $\otimes$ indicates convolution.

If the indicated multiplication is performed in the integrand of equation (5) it will be noted that two of the four resulting terms will have exponentials which vary at a frequency of $(f_0+f_1)$ as a function of $\tau$. Since $s(t)$ is band limited to a band $\Delta F$ which is small in comparison with either $f_0$ or $f_1$, these terms will contribute virtually nothing to the integral. Consequently, they have been neglected in the following more compact expression for the output of chirp filter 22.

$$[x(t) \cdot C_1(t)] \otimes i(t) = \int_{-\Delta T/2}^{\Delta T/2} [s(\tau) \exp\{j2\pi(f_0+f_1)t + \Delta Ft^2/2\Delta T - \Delta Ft\tau/\Delta T]\} \quad (6)$$
$$+ s^*(\tau) \exp\{-j2\pi[(f_0+f_1)t + \Delta Ft^2/2\,\Delta T - \Delta Ft\tau/\Delta T]\}]\, dt$$

The second chirp waveform produced by generator 28 has the form indicated in equation (7).

$$C_2(t) = \begin{cases} \exp[j2\pi(f_3 t - \Delta Ft^2/2\,\Delta T)] \\ + \exp[-j2\pi(f_3 t - \Delta Ft^2/2\,\Delta T)] \text{ for } |t| \leq \frac{\Delta T}{2} \\ 0 \qquad\qquad\qquad\qquad\qquad \text{for } |t| \geq \frac{\Delta T}{2} \end{cases} \quad (7)$$

It will be noted that the second chirp waveform is similar in form to the first chirp waveform but may in general be centered at a different frequency. In the following development, however, it will be assumed that the center frequencies of the two chirp waveforms are identical and equal to $f_1$. Further, since fixed bandpass filter 40 will be tuned to a frequency $f_0+2f_1$, those terms having a frequency content substantially removed from this frequency are not included in the following expression for $f(t)$ the output of the transform unit. Finally, since $s(t)$ is 0 for all $t$ outside the range between $-\Delta T/2$ and $\Delta T/2$, the limits of integration in equation (8) may be changed to the traditional Fourier transform limits of integration with no loss in generality. The output of the transform unit then is given by:

$$f(t) = \exp\{j2\pi(f_0+2f_1)t\} \int_{-\infty}^{\infty} s(\tau)\exp\{-j2\pi\Delta Ft\tau/\Delta T\}\, d\tau$$
$$+ \exp\{-j2\pi(f_0+2f_1)t\} \int_{-\infty}^{\infty} s^*(\tau)\exp\{j2\pi\Delta Ft\tau/\Delta T\}\, d\tau \quad (8)$$

It should be recalled that the output of the transform unit will have substantial values only for times greater than $-\Delta T/2$ and less that $\Delta T/2$. For times in this range, the "frequency term" in the integrals of equation (8), that is the quantity $\Delta Ft/\Delta T$ will range from $-F/2$ to $\Delta F/2$. Accordingly, as time progresses from $-\Delta T/2$ to $\Delta T/2$ the first integral in equation (8) is exactly the classical Fourier transform of $s(t)$ with a frequency ranging from $-\Delta F/2$ to $\Delta F/2$. In other words, the transform unit of FIG. 1 permits the frequency spectrum of $s(t)$ to be displayed along a time axis. This Fourier spectrum, however, is modulated onto a carrier frequency $f_0+2f_1$. Further, the second integral in equation (8) along with its multiplicative exponential functional comprise the complex conjugate of the first integral along with its multiplicative exponential function. As a result $f(t)$ is seen to be a real function as it must be.

Further examination of equation (8) will reveal another significant feature of $f(t)$. The function $f(t)$ is identical in form to $x(t)$, both functions being the sum of a complex number multiplied by a complex exponential and the conjugate of the complex number multiplied by the conjugate of the complex exponential. Moreover, both functions are substantially time-limited and band-limited. It follows that an inverse transform unit almost identical to the direct transform unit of FIG. 1 may be used to transform $f(t)$ back to the time domain quantity $x(t)$. The structure of the inverse transform unit is identical to that shown in FIG. 1 but in the inverse transform unit the frequency slope of the first and second chirp waveforms is positive while the frequency slope of the impulse response of chirp filter 22 is negative.

In the structure of FIG. 1 the sum frequency from both mixers was used while the difference frequencies were filtered off. It will be appreciated by those skilled in the art that if the difference frequency out of one or both of the mixers is used, the same direct and inverse transforms functions can be achieved using different combinations of "up" and "down" chirp waveforms and chirp filters than the specific combinations illustrated.

An even more interesting feature of the Fourier transform unit will become obvious if equation (8) is rewritten in the more compact notation of equation (9):

$$f(t) = S(\Delta Ft/\Delta T)\exp\{j2\pi f_a t\} + S^*(\Delta Ft/\Delta T)\exp\{-j2\pi f_a t\} \quad (9)$$

In equation (9) the quantity $S(\Delta Ft/\Delta T)$ represents the fourier transform of $s(t)$, that is, the first integral in equation (8). Similarly, frequency $f_a$ is equal to the sum $f_0+2f_1$. If a second input function $x_1(t)$ has similarly been processed by a second direct transform unit, then the output of this second unit can be expressed as $f_1(t)$ as in equation (10).

$$f_1(t) = S_1(\Delta Ft/\Delta T) \exp\{j2\pi f_b t\} \\ + S_1^* (\Delta Ft/\Delta T) \exp\{-j2\pi f_b t\} \quad (10)$$

Here $S_1(\Delta Ft/\Delta T)$ is the Fourier transform of $s_1(t)$ and the carrier frequency $f_b$ may in general be different than the carrier frequency $f_a$ of the first direct transform unit. If the product of $f(t)$ and $f_1(t)$ is formed in a mixer and the mixer output bandpass filtered so as to pass only the sum frequency, then the output of the bandpass filter can be expressed as:

$$f(t) \cdot f_1(t) = S(\Delta FT/\Delta T)S_1(\Delta FT/\Delta T) \exp\{j2\pi(f_a+f_b)t\} \\ + S^* (\Delta Ft/\Delta T)S_1^*(\Delta Ft/\Delta T) \exp\{-j2\pi(f_a+f_b)t\} \quad (11)$$

The quantity $S(\Delta Ft/\Delta T) S_1(\Delta Ft/\Delta T)$ is seen to be the product of the Fourier transforms of $s(t)$ and $s_1(t)$. Since the form of the product of $f(t)$ is identical to that of $f(t)$ as given in equation (9), it follows that the product can be inverted by an inverse transform unit so as to yield the convolution of the original time functions that is, $s(t)$ and $s_1(t)$. This procedure is implemented with the time domain programable filter illustrated in block diagram form in FIG. (2).

In FIG. 2 a time-limited substantially band-limited input function $x(t)$ is to be convolved with a desired impulse response function $h(t)$. The input function $x(t)$ appearing on line 50 is processed by direct transform unit 52 so as to provide on line 54 a Fourier transform of the input, such as that illustrated by equation (8). Similarly, the impulse response function appearing on line 56 is processed by direct transform unit 58 so as to provide on line 60 the Fourier transform of the desired impulse response. The product of these two "frequency domain" functions is formed in mixer 62 and filtered by fixed bandpass filter 64 so as to provide on line 66 only the sum frequencies from mixer 62. The signal appearing on line 66, which represents the product of the Fourier transforms of the input function and impulse response, is iverted by inverse transform unit 68 so as to yield at the output a function $o(t)$ which is the convolution of $x(t)$ and $h(t)$. Of course, $o(t)$ will be this convolution modulated onto a carrier frequency.

Each of the transform units in FIG. 2 will be of the type already described in connection with FIG. 1. Mixer 62 may be similar to the aforementioned model 10514A mixer while fixed bandpass filter 64 may be an SWD filter. In certain applications some simplification of the structure illustrated in FIG. 2 may be possible. The function of the fixed bandpass filters in the output of each direct transform unit and of fixed bandpass filter 64 is to select appropriately the sum or difference frequencies out of he respective mixers. In certain cases there may be some redundancy in the operation of these bandpass filters and it may be possible to eliminate one or more of the filters. Alternatively, it may sometimes occur that the chirp filter in inverse transform unit 68 may satisfy the bandpass filter requirements provided by one or more of the preceeding fixed bandpass filters and in such cases the redundant fixed bandpass filters may be eliminated.

In connection with inverse transform unit 68 of FIG. 2 it will be recalled that the bandwidths of input function $x(t)$ and impulse response function $h(t)$ may each be $\Delta F$. The transformed outputs appearing on lines 54 and 60 will also be of bandwidth $\Delta F$ so that the product output by mixer 62 will be of bandwidth 2 $\Delta F$. This corresponds to the fact that this signal represents the Fourier transform of the convolution of a segment of input signal $x(t)$ with a segment of impulse response function $h(t)$. Since both of these segments is of length $\Delta T$, the convolution is of length 2 $\Delta T$. Accordingly, in inverse transform unit 68, the chirp filter impulse response must be 3 $\Delta T$ and the second chirp waveform must be of duration 2$\Delta T$ so as to gate out the valid portion of the chirp filter output.

A modification to the structure of FIG. 2 may be desirable in certain circumstances. In FIG. 2 the input function $h(t)$ was assumed to be a waveform having the shape of the desired filter impulse response, it being assumed that this function $h(t)$ is readily available in the system which employs the programable filter. In some cases, however, such as the matched filter application in a radar system, the function which is readily available in the system is the time inverse of the desired filter impulse response. In such cases, however, it is not necessary to form the time inverse of this function, prior to introducing it into the programable filter of FIG. 2. Rather, direct, transform unit 58 may be replaced by an inverse transform unit. Under these circumstances, in the filtered mixer product appearing on line 66 and represented by equation (11) the term corresponding to the Fourier transform of input function $s(t)$ will be multiplied by the term corresponding to the complex conjugate of the Fourier transform of filter function $h(t)$. Similarly, the term corresponding to the complex conjugate of the Fourier transform of input function $s(t)$ is multiplied by the term corresponding to the Fourier transform of filter function $h(t)$. The net result is that after this product function is inverted by inverse transform unit 68, output function $o(t)$ will be the convolution of input function $x(t)$ with the time inverse of filter function $h(t)$, this convolution again riding on a carrier frequency. In this case $o(t)$ may alternatively be described as the cross-correlation of $x(t)$ and $h(t)$.

As an alternative, when a crosscorrelation is required, both units 52 and 58 in FIG. 2 may be direct transform units, but fixed bandpass filter 64 may be tuned to select the difference frequency in the mixer 62 output. Again in this case the filtered mixer 62 output will contain the product of the term corresponding to the Fourier transform of $s(t)$ and the term corresponding to the conjugate of the transform of $h(t)$ and vice versa.

A filter programable in the frequency domain is illustrated in block diagram form in FIG. 3. Here an input signal $x(t)$ appearing on line 70 is transformed by direct transform unit 72. The output of unit 72 appearing on line 74 is a time varying real signal in which the individual spectral components of the input signl have been resolved in time. This signal is multiplied in mixer 76 with a second input signal H[$f(t)$] appearing on line 78. As the notation for this second signal suggests, the value of the signal at any specific time represents the desired frequency response of the filter at the corresponding frequency. In other words, the desired frequency response of the filter is resolved along the time axis by the inut function H[$f(t)$]. Multiplication of this filler defining signal with the Fourier transform signal appearing on line 74 amounts to frequency-domain application of the filter response to the inut signal transform. It will be seen, therfore, that the output of mixer 76 appearing on line 80 represents the Fourier transform of the filtered input signal. This transform is inverse transformed by inverse transform unit 82 to provide a filtered time domain output signal $o(t)$. The filter is programed by suitably selecting the response function $H[f(t)]$.

Figure 4:
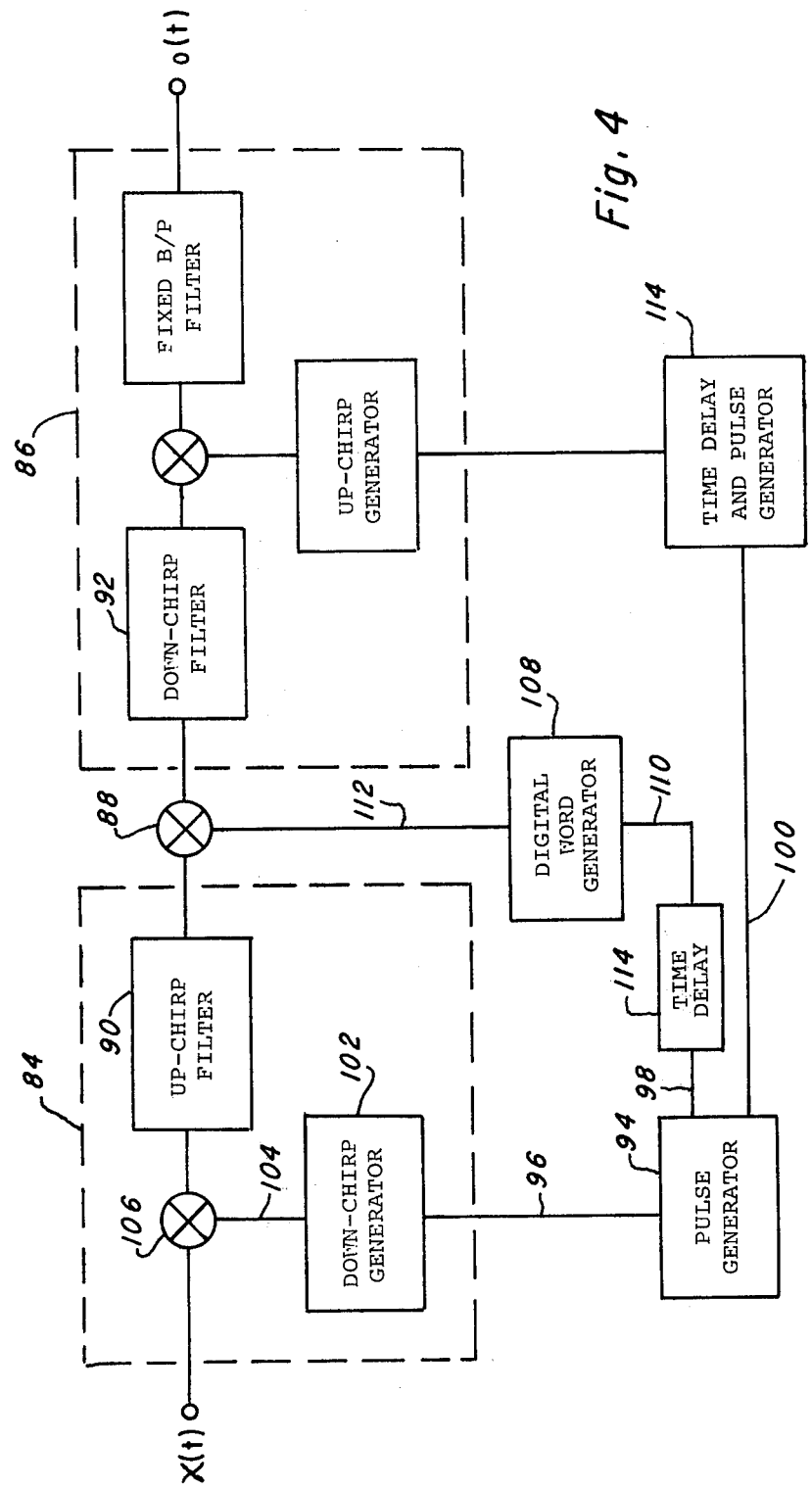
FIG. 4 is a bandpass/bandstop filter, programable in the frequency domain.

One specific embodiment of a frequency-domain programable filter is illustrated in FIG. 4. An input signal $x(t)$ is to be transformed, filtered in the frequency domain, and inverse transformed so as to provide a filtered output function $o(t)$. In the embodiment of FIG. 4 the filtering operation comprises gating selected portions of the Fourier transform function representing the input signal through to the inverse transform unit while blocking undesired portions of the signal representing this Fourier transform. Those skilled in the art will recognize that this amounts to imposing one or more box car passbands on the frequency spectrum of the input signal. Those system elements located within dashed rectangle 84 comprise a direct transform unit while those system components located within dashed rectangle 86 comprise an inverse transform unit. Comparing FIG. 4 with FIG. 1 it will be noed that direct transform unit 84 lacks a second chirp generator and output fixed bandpass filter while inverse transform unit 86 lacks a first chirp generator. This simplification is possible in the specific embodiment of FIG. 4 since the function of the second down chirp generator, if one were used in direct transform unit 84, would be to provide a waveform which when mixed with the output of up chirp filter 90 would serve to remove the up chirp characteristic imposed by the filter. The function of a first up chirp generator if one were employed in inverse transform 86 would be to impose an up chirp characteristic prior to filtering by down chirp filter 92. Since it is not necessary that the chirp characteristic be removed for successful mixing in mixer 88 and since the two missing chirp generators perform inverse functions, it is possible to eliminate these functions in the structure of FIG. 4.

Operation of this frequency-domain programable filter is initiated by pulse generator 94 which simultaneously outputs pulses on lines 96, 98 and 100. Down chirp generator 102, responding to the pulse on line 96 provides a down chirp waveform on line 104. This waveform is mixed in mixer 106 with a finite time segment of input function $x(t)$, the product being further filtered by up chirp filter 90. Digital word generator 108 may be a pulse generator model 8006A manufactured by Hewlett-Packard Inc. Generator 108 in response to a pulse appearing on line 110 provides a digital word on line 12 comprised of a sequence of 32 bits.

Each of the 32 bits of the digital word will be in either a high or low state in accordance with whether the corresponding position key on the word generator has been depressed. The total time duration of the 32 bit word is adjusted to be equal to the time duration of the chirp provided by down chirp generator 102. Assuming that the digital word on line 112 begins immediately upon the occurrence of a pulse on line 110, the time delay provided by time delay unit 114 is set equal to the time delay at the center frequency of up chirp filter 90 plus the time delay between the occurrence of an initiating pulse on line 96 and the onset of the resultant chirp waveform on line 104. Under these circumstnces, it will be seen that the digital word provided by digital word generator 108 will be in time coincidence with the central one-third of the output of up chirp filter 90. It will be recalled that this is the portion of the chirp filter output which contains valid Fourier transform information. Mixer 88 will pass only those portions of this chirp filter output which are in time coincidence with bits of the digital word which are in the on state. This amount to passing only the spectral components of the input signal which fall within selected band pass regions. The specific bands to be passed are selected by depressing the appropriate position keys of the word generator. Programing of the filter is accomplished by simply varying the position keys which are depressed. The transformed filtered output of mixer 88 is inverse transformed by unit 86 to provide a band-pass filtered output signal $o(t)$. In this configuration, the time delay provided by time delay and pulse generator 114 is equal to the sum of the time delays at the center frequencies of up chirp filter 90 and down chirp filter 92.

In view of the abrupt rise and fall times of the frequency response function provided by digital word generator 108, the bandwidth of this function may be excessive. It will be necessary in such cases to filter the output of the digital word generator to restrict this bandwidth. This type of filtering may be accomplished with a fixed SWD bandpass filter and will have the effect of smoothing the pulse leading and trailing edges. The digital word generator 108, therefore, is intended to include such a filter when required.

Figure 5:
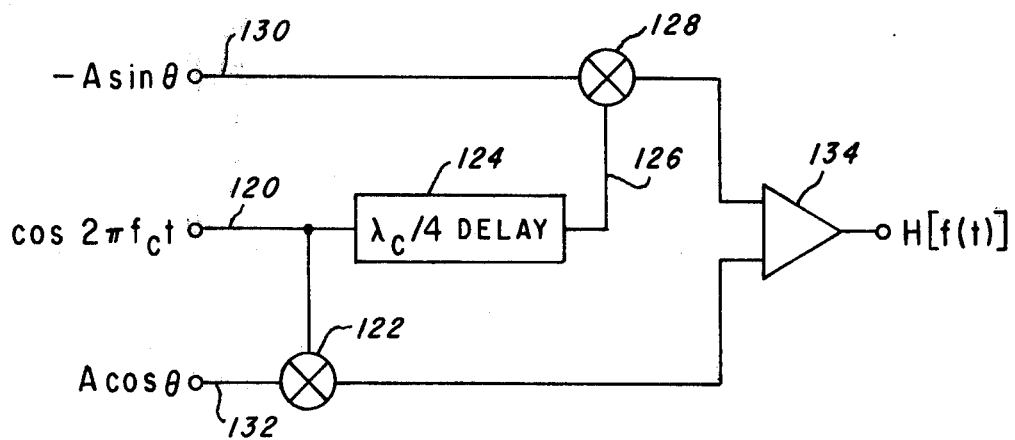
FIG. 5 illustrates a structure for selectably generating a frequency response function.

While a specific rather simple frequency response function is implemented by the structure of FIG. 4, other more involved frequency response functions may be synthesized as is illustrated in FIG. 5. From equation (10) it will be seen that the general form of the frequency response function is given by:

$$H[f(t)] = H\exp\{2\pi f_c t\} + H^* \exp\{-j2\pi f_c t\} \quad (12)$$

where $H$ is a complex function representing the desired frequency response and $f_c$ is a selected carrier frequency. The frequency response function $H$ may be expressed more conveniently as:

$$H = A \exp\{j\theta\} \quad (13)$$

where $A$ is a time varying function which represents the desired amplitude response of the filter and $\theta$ is a time varying function which represents the desired phase response of the filter. By combining equations (12) and (13) and substituting trigonometric quantities for the corresponding complex exponential quantities, it will be seen that the time function defining the filter response in the frequency domain may be of the form:

$$H[f(t)] = a \cos\theta \cos 2\pi f_c t - A \sin\theta \sin 2\pi f_c t \quad (14)$$

This function is synthesized by the structure of FIG. 5.

One input to the structure of FIG. 5 is the trigonometric function $\cos 2\pi f_c t$. This function appearing on line 120 provides one of the inputs to mixer 122 and is readily provided by any of a number of commercially available signal generators. This cosine function is also an input to quarter wavelength delay line 124. Quarter wavelength delay line 124 may be simply a segment of transmission line of sufficient length to provide a quarter wavelength delay at the carrier frequency $f_c$. The output of quarter wavelength delay line 124 appearing on line 126 may be expressed as $\sin 2\pi f_c t$ since it is in phase quadrature with the input trigonometric function. This sine function provides one input to mixer 128. Two other inputs to the structure appearing on lines 130 and 132 respectively, are the functions $-A \sin\theta$ and $\cos\theta$. Functions of this type may be provided in various ways, it being well known in the analog computer art for example to generate functions of the type required on lines 130 and 132. The input functions —A sin θ and A cos θ are multiplied in mixers 128 and 122 with the appropriate functions of the carrier frequency and then combined in summer 134 to yield an H [f(t)] of the form given in equation (14). This function may be coupled to mixer 76 in FIG. 3 so as to provide a versatile frequency-domain programable filter unit. Programing of the filter is accomplished by varying the functions —A sin θ and A cos θ.

To this point, the various programable filters of the invention have been disclosed in connection with input signals of limited length ΔT. In many situations of interest, however, the duration of the input signal $x(t)$ will be longer than the length ΔT of any segment which may be practically employed in any of the filters of the present invention. The applicability of the programable filter to input signals of this type will next be discussed.

With reference to FIG. 1, the direct transform unit can process a continuous input function $x(t)$ if the clock input comprises a pulse train with the interval between adjacent pulses being equal to the duration of the first chirp waveform ΔT. This will cause first chirp waveform generator 12 to repetitively generate chirp waveforms which, when multiplied by mixer 18 with the input signal, will continuously gate successive segments of the input signal into the transform unit. Each such segment will be transformed in the manner previously discussed so that the output function $f(t)$ will be a continuous waveform comprised of the transforms of successive segments of the input waveform $x(t)$.

It will be recalled, however, that for any given segment the output of chirp filter 22 is of duration 3 ΔT and that the signal provided by second chirp waveform generator 28, inter alia, performs the function of gating only the useful central one-third of this chirp filter output. In the continuous mode of operation, however, it will be recognized that during the time duration of this central one-third of the chirp filter output for a given segment of input data, there will also be present on line 24 the last one-third of the chirp filter output for the previous segment of input data and the first one-third of the chirp filter output for the next successive segment of input data. In other words, the useful data gated through mixer 26 for any given segment will be corrupted by superfluous data from the next preceeding and successive segments. As a result, there will be some error in the output function $f(t)$. In many cases, however, the magnitude of this error will be acceptably small and the direct transform unit of FIG. 1 as well as the inverse transform units may be used to process continuous input waveforms.

If the time-domain programmable filter of FIG. 2 is to be used to process a continuous input signal $x(t)$, the direct transform unit 52 must be configured to continuously transform consecutive segments of the input signal in the manner discussed above. In one such application, the filter impulse response function $h(t)$ will be of length ΔT and this impulse response function $h(t)$ will be of length ΔT and this impulse response function will be repetitively gated into direct transform unit 58. As a result, there will appear on line 60 a periodic repetition of the Fourier transform of the impulse response function $h(t)$. The transform of each segment of the input function is multiplied by the transform of the impulse response function in mixer 62 so that the output of mixer 62 comprises a sequence of segments, each of which comprises the Fourier transform of a filtered input segment. These segments are continuously gated through inverse transform unit 68 so that the output function $o(t)$ comprises a continuous waveform representative of the input function $x(t)$ convolved with the impulse response function $h(t)$.

In an analagous manner, the frequency-domain programable filter of FIG. 3 will process a continuous input function if H[f(t)] is provided repetitively. There must be a repetition of this function for each segment of the input signal that is processed through direct transform unit 72.

In cases where the errors introduced as a result of utilizing the transform units in a continuous fashion are unacceptable, an alternative embodiment of the invention may be used. This embodiment will be illustrated in connection with the time-domain programable filter of FIG. 6.

Figure 6:
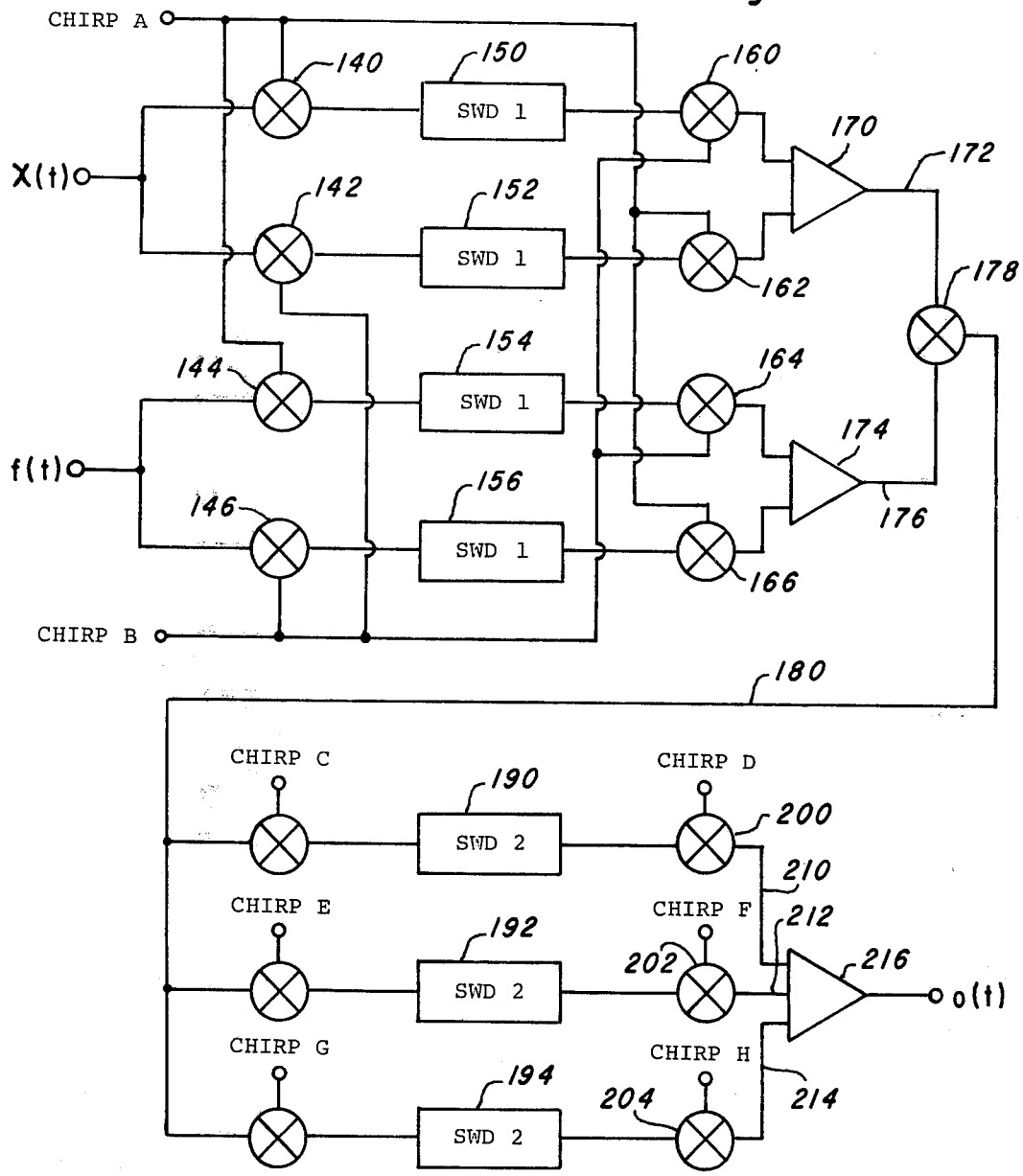
FIG. 6 is a diagram of a programable filter for use with continuous signals.

For ease of understanding, some details such as fixed bandpass filters and means for generating chirp waveforms have not been included in FIG. 6, these features having been disclosed in connection with previous figures. Chirps A through H for example in FIG. 6 represent the outputs of chirp waveform generators such as generators 12 and 28 of FIG. 1. Chirp A consists of a basic chirp waveform which occurs repetitively on a periodic basis. The basic chirp waveform is of time duration ΔT and of bandwidth ΔF. The interval between the end of one periodic repetition of the basic chirp waveform and the beginning of the next is equal to ΔT. Chirp B is identical to chirp A with the exception of the fact that the occurrences of the basic chirp waveforms in chirp B occur during those intervals between the times of occurrence of the basic chirp waveforms in chirp A. In this way, consecutive segments of input signals $x(t)$ are alternately gated through mixers 140 and 142 into a first and a second channel of a first direct transform unit. Similarly, chirps A and B alternately gate the reference waveform $f(t)$ through mixers 144 and 146 into a first and a second channel of a second direct transform unit. In this embodiment it is contemplated that reference waveform $f(t)$ will comprise periodic repetitions of a basic desired impulse response function, the period of each repetition being equal to ΔT.

From the foregoing it will be seen tht the output of each of mixers 140, 142, 144 and 146 will contain segments of data each of length ΔT separated by intervening segments where no data is present, the intervening segments also being of length ΔT. Moreover, during those intervals when active data is present in the output of mixers 140 and 144, there will be no active data present in the output of mixers 142 and 146. Chirp filters 150, 152, 154 and 156 each comprise, in the preferred embodiment, a first type of surface wave device, the impulse response of this surface wave device being of duration 2 ΔT. In the embodiment of FIG. 6 it is assumed that the time delay through this first type of surface wave device at its center frequency is equal to ΔT. If this condition is satisfied, then chirp B which gates the input function $x(t)$ through mixer 142 may also be used to gate the output of chirp filter 150 through mixer 160. It will be recalled that in a structure of this type, the output of chirp 150 will be of length 3 ΔT, but that the first ΔT seconds of this output will contain superflous taper-on data while the last ΔT of this output will contain superfluous taper-off data. The ΔT seconds of taper-off data from one segment of $x(t)$ gated through mixer 140 overlaps the ΔT seconds of taper-on data for the next segment of $x(t)$ gated through mixer 140. During the ΔT seconds of valid data that is gated out of chirp filter 150 by mixer 160 for any given segment, however, there will be no overlap with data from the preceeding or succeeding segments gated into this first channel by mixer 140. The output of mixer 160 contains time segments of data which represent the Fourier transforms of every other segment of input function $x(t)$. Similarly, the output of mixer 162 comprises a plurality of time segments of data which represent the Fourier transforms of the remaining segments of $x(t)$. The outputs of mixers 160 and 162 are combined in summation unit 170 so as to yield on line 172 a continuous time function comprised of consecutive segments of data each of which represents the Fourier transform of one segment of input function $x(t)$. In a similar manner the output of mixers 164 and 166 are combined by summation unit 174 so as to provide on line 176 a continuous waveform comprises of a plurality of segments, each of these segments representing the Fourier transform of the basic impulse response function in $f(t)$.

The signals appearing on lines 172 and 176 are multiplied in mixer 178 so as to provide on line 180 a continuous function comprised of a plurality of segments, each of these segments representing the product of the Fourier transform of the basic impulse response function with the Fourier transform of one of the segments of input function $x(t)$. It will be observed that both the signal appearing on line 172 and that appearing on line 176 has a bandwidth equal to the processor bandwidth ΔF. When these two signals are multiplied in mixer 178, the resultant signal appearing on line 180 will have a bandwidth equal to the sum of these two input bandwidths, that is, 2 ΔF. This doubling of the bandwidth of the signal on line 180 results from the fact that each segment of this signal represents the product of the Fourier transforms of one segment of the input signal $x(t)$ and one segment of the input reference function $f(t)$. In other words, each segment of the signal appearing on line 180 is a Fourier transform of the convolution of one segment of the input signal with one segment of the reference signal. Since the segment length of each of these signals is ΔT, it follows that the convolution of one segment from each signal will be of length 2ΔT.

The remaining structure of FIG. 6 comprises an inverse transform unit. Chirps C, E, and G are similar to chirps A and B, each being comprised of basic chirp segments of length ΔT and bandwidth ΔF but having slopes opposite to those of chirps A and B. Additionally, in chirps C, E, and G, any two consecutive chirp segments of length ΔT are separated by an interval with zero data of length 2 ΔT. Moreover, the on periods of chirps C, E and G alternate so that at any given point in time, data from the signal appearing on line 180 is gated into only one of the three channels of the inverse transform unit. Chirp filters 190, 192 and 194 each comprise an identical second type of surface wave device, the impulse response of which has a time duration of 3 ΔT and bandwith of 3 ΔF. The output from any of chirp filters 190, 192 or 194 in response to one of the segments of the signal appearing on line 180 has a time duration of 4 ΔT of which the first ΔT segment and the last ΔT segment are superfluous. Chirps D, F and H are each comprised of a plurality of basic chirp waveform segments, each of these segments being of time duration 2 ΔT and bandwidth 2 ΔF and having a slope opposite to the slope of chirps A and B. The basic chirp waveform segments in chirps D, F and H are separated by intervals of length ΔT. Thus, chirp D is multiplied in mixer 200 with the output of chirp filter 190 so as to remove the frequency slope imposed by chirp filter 190 and gate out the center 2 ΔT segment of each output of chirp filter 190. Each such output of mixer 200 appearing on line 210 is the convolution of one segment of original input fiunction $x(t)$ with one segment of reference function $f(t)$. Each basic chirp segment in the chirp F waveform lags the basic chirp segment in the chirp D waveform by a time interval ΔT. Similarly, each basic chirp segment in the chirp H waveform lags a basic chirp segment in the chirp F waveform by a time duration ΔT. Just as in the case of mixer 200, mixers 202 and 204 gate onto lines 212 and 214 respectively segments of data representing the convolution of segments of the input function with segments of the reference function. Moreover, the filtered input segments appear consecutively on lines 210, 212 and 214 so that when combined in summation unit 216 they provide an output function $o(t)$ which is the convolution of the continuous input waveform $x(t)$ with the basic impulse response function which goes to make up reference waveform $f(t)$.

While the continuous filter of FIG. 6 is programable in the time domain, a similar frequency-demain programable filter may also be implemented. In this case the direct transform structure which operates on the impulse response function $f(t)$ would be replaced by a structure of the type illustrated in FIG. 5. This structure would be modified so as to provide on line 176 a function H $[f(t)]$ comprised of consecutive segments, each of which is a basic frequency response function. Alternatively both the time-domain and frequency-domain programable features may be combined in a single embodiment of the invention. Additionally the various embodiments of the invention can be modified to provide for the filtering of more than one input signal, or the filtering of one or more input signals by more than one reference waveform.

Whereas certain specific embodiments of the invention have been disclosed, there may occur to those skilled in the art minor modifications which do not depart from the spirit and scope of the invention as set forth in the appended claims.

What is claimed is:

1. A device for performing transform operations on an input signal, said device comprising:
    a first acoustic surface wave generator means for providing a first chirp signal having a substantially linearly varying frequency,
    first mixer means having a first input adapted to receive the input signal and a second input connected to said first generator means for multiplying said input signal and said first chirp signal to provide a first product between said input signal and said first chirp signal,
    an acoustic surface wave chirp filter connected to the output of said first mixer means and responsive to said first product to provide an impulse response having a substantially linearly varying frequency as a filtered output signal,
    a second acoustic surface wave generator means for providing a second chirp signal having a substantially linearly varying frequency,
    second mixer means having a first input connected to said chirp filter and a second input connected to said second generator means for multiplying said filtered output signal and said second chirp signal to provide a second product between said filtered output signal and said second chirp signal, first and second pulse generators respectively operably connected to the inputs of said first and second generator means, said first and second generator means being responsive to pulses from said first and second pulse generators for producing said first and second chirp signals, said second pulse generator being connected to the output of said first pulse generator and being provided with delay means for producing a pulse output to said second generator means at a fixed time delay after receiving a pulsed output from said first pulse generator such that said second chirp signal provided by said second generator means lags said first chirp signal provided by said first generator means by a predetermined time delay, and a bandpass filter connected to the output of said second mixer means and responsive to said second product for selecting a desired band of frequencies from said second product.

2. A device as set forth in claim 1, wherein the time delay between the pulses respectively output from said first and second pulse generators is equal to the time delay through said chirp filter at the center frequency thereof.

3. A device a sset forth in claim 2, wherein said first and second generator means are respectively constructed so as to provide said first and second chirp signals having a time duration equal to or greater than $\Delta T$ and a bandwidth equal to or greater than $\Delta F$, and said chirp filter is constructed to have a bandwidth equal to at least twice the bandwidth of said first generator means, such that the device is adapted to perform transform operations on an input signal which is time limited to a time period $\Delta T$ and substantially band limited to a frequency band $\Delta F/2$ on either side of a center frequency $f_0$.

4. A device as set forth in claim 3, wherein the center frequency of said chirp filter is equal to the sum of $f_0$ and the center frequency of said first chirp signal.

5. A filter, programmable in the time-domain, for convolving an input signal with a reference signal, said filter comprising:
   first, second and inverse signal transform means, each signal transform means comprising
   a first acoustic surface wave generator means for providing a first chirp signal having a substantially linearly varying frequency,
   first mixer means having a first input connected to receive a respective input signal and a second input connected to said first generator means for multiplying said respective input signal and said first chirp signal to provide a first product between said respective input signal and said first chirp signal,
   an acoustic surface wave chirp filter connected to the output of said first mixer means and responsive to said first product to provide an impulse response having a substantially linearly varying frequency as a filtered output signal,
   a second acoustic surface wave generator means for providing a second chirp signal having a substantially linearly varying frequency,
   second mixer means having a first input connected to said chirp filter and a second input connected to said second generator means for multiplying said filtered output signal and said second chirp signal to provide a second product between said filtered output signal and said second chirp signal, first and second pulse generators respectively operably connected to the inputs of said first and second generator means, said first and second generator means being responsive to pulses from said first and second pulse generators for producing said first and second chirp signals, said second pulse generator being connected to the output of said first pulse generator and bring provided with delay means for producing a pulse output to said second generator means at a fixed time delay after receiving a pulsed output from said first pulse generator such that said second chirp signal provided by said second generator means lags said first chirp signal provided by said first generator means by a predetermined time delay, and a bandpass filter connected to the output of said second mixer means and responsive to said second product for selecting a desired band of frequencies from said second product, said first signal transform means being responsive to said input signal for providing a first electrical signal representative of a frequency-domain replica of said input signal, said second signal transform means being responsive to said reference signal for providing a second electrical signal representative of a frequency-domain replica of said reference signal, mixer means having a first input connected to said first signal transform means and a second input connected to said second signal transform means for multiplying said first and second electrical signals to provide a third electrical signal representative of the product of the outputs of said first and second signal transform means, and said inverse signal transform means being operably connected to the output of said mixer means and responsive to said third electrical signal to provide an electrical signal output representative of the time-domain convolution of said input signal and said reference signal.

6. A filter as set forth in claim 5, further including a bandpass filter interconnected between the output of said mixer means and the input of said inverse signal transform means, and said bandpass filter being responsive to said third electrical signal to provide a filtered output signal for reception by said inverse transform means.

7. A filter, programmable in the frequency domain, for filtering an input signal, said filter comprising:
   first signal transform means and inverse signal transform means, each signal transform means comprising
   a first acoustic surface wave generator means for providing a first chirp signal having a substantially linearly varying frequency,
   first mixer means having a first input adapted to receive a respective input signal and a second input connected to said first generator means for multiplying said respective input signal and said first chirp signal to provide a first product between said respective input signal and said first chirp signal,
   an acoustic surface wave chirp filter connected to the output of said first mixer means and responsive to said first product to provide an impulse response having a substantially linearly varying frequency as a filtered output signal, a second acoustic surface wave generator means for providing a second chirp signal having a substantially linearly varying frequency, second mixer means having a first input connected to said chirp filter and a second input connected to said second generator means for multiplying said filtered output signal and said second chirp signal to provide a second product between said filtered output signal and said second chirp signal, first and second pulse generators respectively operably connected to the inputs of said first and second generator means, said first and second generator means being responsive to pulses from said first and second pulse generators for producing said first and second chirp signals, said second pulse generator being connected to the output of said first pulse generator and being provided with delay means for producing a pulse output to said second generator means at a fixed time delay after receiving a pulsed output from said first pulse generator such that said second chirp signal provided by said second generator means lags said first chirp signal provided by said first generator means by a predetermined time delay, and a bandpass filter connected to the output of said second mixer means and responsive to said second product for selecting a desired band of frequencies from said second product, said first signal transform means being responsive to said input signal for providing a first electrical signal representative of a frequency-domain replica of said input signal, means for generating a reference signal as a second electrical signal representative of the desired frequency response of said filter, mixer means having a first input connected to said first signal transform means and a second input connected to said reference signal-generating means for multiplying said first and second electrical signals to provide a third electrical signal representative of the product of said first and second electrical signals, and said inverse signal transform means being connected to the output of said mixer means and responsive thereto to provide an electrical signal output representative of the time-domain convolution of said input signal and the impulse response of the filter represented by said second electrical signal.

8. A filter as set forth in claim 7, wherein said reference signal-generating means is operable to generate the reference signal as said second electrical signal representative of a desired frequency response of said filter having non-zero amplitude and phase for at least one frequency.

9. A filter as set forth in claim 7, wherein said mixer means is operable in cooperation with said second electrical signal to gate selected portions of said first electrical signal into said inverse signal transform means.

10. A bandpass/bandstop filter, programable in the frequency domain, comprising:

first generator means for providing a first chirp signal having a substantially linearly varying frequency, first mixer means having a first input adapted to receive an input signal and a second input connected to said first generator means for multiplying said input signal and said first chirp signal to provide a first product between said input signal and said first chirp signal, a first chirp filter connected to the output of said first mixer means and responsive to said first product to provide an impulse response having a substantially linearly varying frequency as a first filtered output signal, gating means including a mixer means connected to the output of said first chirp filter for passing selectable time gates of the first filtered output signal from said first chirp filter, a second chirp filter connected to the output of the mixer means included in said gating means for receiving the output thereof to provide an impulse response having a substantially linearly varying frequency as a second filtered output signal, second generator means for providing a second chirp signal having a substantially linearly varying frequency, second mixer means having a first input connected to said second chirp filter and a second input connected to said second generator means for multiplying said second filtered output signal and said second chirp signal to provide a second product between said second filtered output signal and said second chirp signal, and a bandpass filter connected to the output of said second mixer means and responsive to said second product for selecting a desired band of frequencies from said second product.

11. A filter as set forth in claim 10, wherein said first generator means is a down-chirp generator for providing said first chirp signal as a down-chirp waveform, said first chirp filter is an up-chirp filter, said second chirp filter is a down-chirp filter, and said second generator means is an up-chirp generator for providing said second chirp signal as an up-chirp waveform.

12. A filter as set forth in claim 10, further including first and second pulse generators respectively operably connected to the inputs of said first and second generator means, said first and second generator means being responsive to pulses from said first and second pulse generators for producing said first and second chirp signals, said second pulse generator being connected to the output of said first pulse generator and being provided with delay means for producing a pulse output to said second generator means at a fixed time delay after receiving a pulse output from said first pulse generator, the output of said first pulse generator also being connected to the mixer means included in said gating means, and time delay means and digital work generator means being interconnected between the output of said first pulse generator and the mixer means of said gating means.

13. A filter as set forth in claim 10, wherein said first and second generator means and said first and second chirp filters respectively comprise surface wave devices.

14. A programable filter for use with a continuous input signal, said filter comprising:

a direct signal transform unit for the input signal comprised of at least two channels, each of said channels including a first mixer responsive to a first chirp signal and to said input signal for gating selected segments of said input signal into said channel, a chirp filter connected to the output of said first mixer, and a second mixer connected to the output of said chirp filter and responsive to a second chirp signal and to the output of said chirp filter for gating selected portions of the chirp filter output signal out of the channel, and summation means connected to the outputs of said second mixers of each of said channels for combining the gated outputs of said at least two channels;

means for generating a reference signal representative of a desired frequency-domain response signal;

mixer means connected to the output of said summation means and to said reference signal-generating means for forming the product of said reference signal with the output signal of said summation means; and an inverse signal transform unit connected to the output of said mixer means and comprised of at least three channels, each of said channels including a first mixer means responsive to a first chirp signal and to the output of said mixer means for gating selected segments of said output into said respective channel, a chirp filter connected to the output of said first mixer means and responsive thereto, and a second mixer means connected to the output of said chirp filter and being responsive to a second chirp signal and to the output of said chirp filter for gating selected portions of the chirp filter output signal out of the respective channel, and a summation means connected to each of said second mixer means of the respective channels for combining the gated outputs of said at least three channels.

15. A filter as set forth in claim 14, wherein said reference signal-generating means is structured to provide a reference signal comprising a plurality of like segments, with each of said segments representing a basic frequency-domain response function.

16. A filter as set forth in claim 15, wherein said reference signal-generating means is structured to provide a reference signal representing the desired frequency-domain response signal which is programable in the frequency-domain.

17. A filter as set forth in claim 15, wherein said reference signal-generating means is structured to provide a reference signal representing the desired frequency-domain response signal which is programable in the time-domain.

18. A filter as set forth in claim 15, wherein the respective first mixers of the channels of said direct signal transform unit are adapted to alternatively receive consecutive segments of said input signal in a continuous sequence, and the respective second mixers of the channels being alternately operable to gate selected portions of the respective chirp filter output signals out of the channels corresponding to consecutive segments of said input signal.

19. A filter as set forth in claim 18, further including a second direct signal transform unit operably associated with said reference signal-generating means, said second direct signal transform unit being comprised of the same structure as said direct signal transform unit for said input signal and being operable on said reference signal concurrently with the operation of said direct signal transform unit on said input signal.

20. A filter, programmable in the time-domain, for cross-correlating an input signal with a reference signal, said filter comprising:

direct signal transform means and first and second inverse signal transform means, each signal transform means comprising a first acoustic surface wave generator means for providing a first chirp signal having a substantially linearly varying frequency, first mixer means having a first input adapted to receive a respective input signal and a second input connected to said first generator means for multiplying said respective input signal and said first chirp signal to provide a first product between said respective input signal and said first chirp signal, an acoustic surface wave chirp filter connected to the output of said first mixer means and responsive to said first product to provide an inpulse response having a substantially linearly varying frequency as a filtered output signal, a second acoustic surface wave generator means for providing a second chirp signal having a substantially linearly varying frequency, second mixer means having a first input connected to said chirp filter and a second input connected to said second generator means for multiplying said filtered output signal and said second chirp signal to provide a second product between said filtered output signal and said second chirp signal, first and second pulse generators respectively operably connected to the inputs of said first and second generator means, said first and second generator means being responsive to pulses from said first and second pulse generator for producing said first and second chirp signals, said second pulse generator being connected to the output of said first pulse generator and being provided with delay means for producing a pulse output to said second generator means at a fixed time delay after receiving a pulsed output from said first pulse generator such that said second chirp signal provided by said second generator means lags said first chirp signal provided by said first generator means by a predetermined time delay, and a bandpass filter connected to the output of said second mixer means and responsive to said second product for selecting a desired band of frequencies from said second product, said direct signal transform means being responsive to said input signal for providing a first electrical signal representative of a frequency-domain replica of said input signal, means for generating a reference signal, said first inverse signal transform means having an input connected to said reference signal-generating means and being responsive to the reference signal for providing a second electrical signal representative of a frequency-domain replica of said reference signal, mixer means having a first input connected to said direct signal transform means and a second input connected to said first inverse signal transform means for multiplying said first and second electrical signals to provide a third electrical signal representative of the product of the outputs of said direct and first inverse signal transform means, and said second inverse signal transform means being operably connected to the output of said mixer means and responsive thereto to provide an electrical signal output representative of the time-domain cross-correlation of said input signal and said reference signal.

* * * * *